United States Patent
Chang

[15] 3,661,588
[45] May 9, 1972

[54] **PHOTOPOLYMERIZABLE COMPOSITIONS CONTAINING *P* AMINOPHENYL KETONES AND ADJUVANTS**

[72] Inventor: Catherine Teh-Lin Chang, Claymont, Del.

[73] Assignee: E. I. du Pont de Nemours and Company, Wilmington, Del.

[22] Filed: Nov. 18, 1969

[21] Appl. No.: 877,853

[52] U.S. Cl. ..............................96/86 P, 96/87 R, 96/115 P
[51] Int. Cl. ..............................G03c 1/70
[58] Field of Search ..............................96/115 P, 115, 35.1

[56] References Cited

UNITED STATES PATENTS 3,549,367 12/1970 Chang et al. ..............................96/35.1
3,479,185 11/1969 Chambers ..............................96/84
3,488,269 1/1970 Allen et al. ..............................96/115 X

*Primary Examiner*—Ronald H. Smith
*Attorney*—James T. Corle

[57] ABSTRACT

Photopolymerizable compositions comprising an ethylenically unsaturated monomer and an initiating combination of an aminophenyl ketone and a free-radical producing hydrogen donor compound selected from active methylene compounds and amino compounds.

13 Claims, No Drawings

PHOTOPOLYMERIZABLE COMPOSITIONS CONTAINING AMINOPHENYL KETONES AND ADJUVANTS

BACKGROUND OF THE INVENTION

This invention relates to photopolymerizable compositions of matter and more particularly to improved such compositions having a higher photographic speed. Still more particularly, it relates to compositions having added chemical compounds which increase the speed of photopolymerization.

It is known to add certain light absorbing compounds to photopolymerizable compositions comprising ethylenically unsaturated monomers for the purpose of increasing the photographic speed.

The use of aromatic ketones including aminophenyl ketones as sensitizers in photopolymerizable compositions is disclosed in Leekley et al. U.S. Pat. No. 3,081,168.

Photopolymerizable compositions using combinations of aminophenyl ketones such as Michler's ketone with other sensitizers as initiators for photopolymerization of photopolymerizable polymers giving photospeed increases greater than would be expected from the sum of the effects of the individual compounds are disclosed in British Pat. No. 1,090,142.

It has now been found that many compounds including some which do not of themselves initiate photopolymerization of ethylenically unsaturated monomers or do so very poorly can be combined with an aminophenyl ketone in a sensitizing combination capable of giving increased photospeed to photopolymerizable compositions.

SUMMARY OF THE INVENTION

It is an object of this invention to provide new and useful photopolymerizable compositions. A further object is to provide new and improved initiator combinations for such photopolymerizable compositions. A further object is to provide auxiliary compounds capable of increasing the photospeed of photopolymerization initiated by aminophenyl ketones.

The compositions of this invention comprise:

a. at least one non-gaseous ethylenically unsaturated compound containing at least one terminal ethylenic group, having a boiling point above 100° C. at normal atmospheric pressure and being capable of forming a high polymer by photoinitiated addition polymerization, b. a thermoplastic macromolecular organic polymer binder, c. an aminophenyl ketone, and d. as the sole additional free-radical producing compound a hydrogen donor, free-radical producing compound selected from the group consisting of active methylene compounds and amino compounds.

Constituents (a) and (b) are present in amounts from 3 to 100 and 0 to 97 parts by weight, respectively. For every 100 parts by weight of (a) or (a) and (b), there are used 0.001 to 10 parts by weight of each of (c) and (d).

Elements using this composition comprise at least one layer of the above-described composition coated on a support. A cover sheet may be provided to exclude oxygen.

DESCRIPTION OF THE PREFERRED EMBODIMENTS

The photopolymerizable compositions of this invention preferably comprise the four constituents set forth above, there being at least five parts by weight of constituent (b).

The preferred photopolymerizable compositions contain, in addition to constituents (a), (b), (c), and (d), an additional constituent:

e. a thermal addition polymerization inhibitor.

Suitable free-radical initiated, chain-propagating, addition polymerizable, ethylenically unsaturated compounds include preferably an alkylene or a polyalkylene glycol diacrylate prepared from an alkylene glycol of 2 to 15 carbons or a polyalkylene ether glycol of 1 to 10 ether linkages, and those disclosed in Martin and Barney U.S. Pat. No. 2,927,022, issued Mar. 1, 1960, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester or amide structures. The following specific compounds are further illustrative of this class; unsaturated esters of alcohols, preferably polyols and particularly such esters of the alpha-methylene carboxylic acids, e.g., ethylene glycol diacrylate, diethylene glycol diacrylate, glycerol diacrylate, glycerol triacrylate, ethylene glycol dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,3-pentanediol dimethacrylate, the bis-acrylates and methacrylates of polyethylene glycols of molecular weight 200–500, and the like; unsaturated amides, particularly those of the alpha-methylene carboxylic acids, and especially those of alpha-omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine trismethacrylamide, bis (gamma-methacrylamidopropoxy) ethane beta-methacrylamidoethyl methacrylate, N-(betahydroxyethyl)-beta-(methacrylamido) ethyl acrylate and N,N-bis (beta-methacryloxyethyl) acrylamide; vinyl esters such as divinyl succinate, divinyl adipate, divinyl phthalate, divinyl terephthalate, divinyl benzene-1,3-disulfonate, and divinyl butane-1,4-disulfonate; styrene and derivatives thereof and unsaturated aldehydes, such as sorbaldehyde (hexadienal). An outstanding class of these preferred addition polymerizable components are the esters and amides of alpha-methylene carboxylic acids and substituted carboxylic acids with polyols and polyamines wherein the molecular chain between the hydroxyls and amino groups is solely carbon or oxygen-interrupted carbon. The preferred monomeric compounds are polyfunctional, but monofunctional monomers can also be used. In addition, the polymerizable, ethylenically unsaturated polymers of Burg U.S. Pat. No. 3,043,805, Martin U.S. Pat. No. 2,929,710 and similar materials may be used alone or mixed with other materials. Acrylic and methacrylic esters of polyhydroxy compounds such as pentaerythritol and trimethylolpropane, and acrylic and methacrylic esters of adducts of ethylene oxide and polyhydroxy compounds such as those described in Cohen and Schoenthaler, U.S. Pat. No. 3,380,831 are also useful. The photocrosslinkable polymers disclosed in Schoenthaler, U.S. Pat. No. 3,418,295, and Celeste, U.S. Pat. No. 3,448,089, may also be used. The amount of monomer added varies with the particular polymer used.

Aminophenyl ketones useful in the compositions of this invention comprise those of the formula

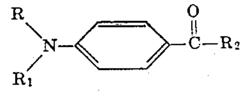

where R and $R_1$ each are H or alkyl of 1–4 carbons, and $R_2$ may be alkyl of 1–4 carbons, aryl, aminoaryl, and alkyl-substituted aminoaryl, where alkyl is 1-4 carbons. Aryl is preferably phenyl. A preferred compound is Michler's Ketone, p,-p'-bis(dimethylamino)benzophenone. Suitable p-aminophenyl ketones are described in Assignee's Fishman application, Ser. No. 654,677, filed July 20, 1967, now U.S. Pat. No. 3,552,973.

Suitable thermoplastic polymers for component (c) have molecular weights of at least 10,000 and include A. Copolyesters, e.g., those prepared from the reaction product of a polymethylene glycol of the formula $HO(CH_2)_nO$ H, wherein n is a whole number 2 to 10 inclusive, and (1) hexahydroterephthalic, sebacic and terepthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids.

B. Nylons or polyamides, e.g., N-methoxymethyl polyhexamethylene adipamide;

C. Vinylidene chloride copolymers, e.g., vinylidene chloride/acrylonitrile; vinylidene chloride/methacrylate and vinylidene chloride/vinylacetate copolymers;

D. Ethylene/vinyl acetate copolymers;

E. Cellulosic ethers, e.g., methyl cellulose, ethyl cellulose and benzyl cellulose;

F. Polyethylene;

G. Synthetic rubbers, e.g., butadiene/acrylonitrile copolymers, and chloro-2-butadiene-1,3 polymers;

H. Cellulose esters, e.g., cellulose acetate, cellulose acetate succinate and cellulose acetate butyrate;

I. Polyvinyl esters, e.g., polyvinyl acetate/acrylate, polyvinyl acetate/methacrylate and polyvinyl acetate;

J. Polyacrylate and alpha-alkyl polyacrylate esters, e.g., polymethyl methacrylate and polyethyl methacrylate;

K. High molecular weight polyethylene oxides of polyglycols having average molecular weights from 4,000 to 1,000,000;

L. Polyvinyl chloride and copolymers, e.g., polyvinyl chloride/acetate;

M. Polyvinyl acetal, e.g., polyvinyl butyrol, polyvinyl formal;

N. Polyformaldehydes;

O. Polyurethanes;

P. Polycarbonates;

Q. Polystyrenes.

To the thermoplastic polymer constituent of the photopolymerizable composition there can be added non-thermoplastic polymeric compounds to improve certain desirable characteristics, e.g., adhesion to the base support, adhesion to the image-receptive support on transfer, wear properties, chemical inertness, etc. Suitable non-thermoplastic polymeric compounds include polyvinyl alcohol, cellulose, anhydrous gelatin, phenolic resins and melamine-formaldehyde resins, etc. If desired, the photopolymerizable layers can also contain immiscible polymeric or non-polymeric organic or inorganic fillers or reinforcing agents which are essentially transparent at the wave lengths used for the exposure of the photopolymeric material, e.g., the organophilic silicas, bentonites, silica, powdered glass, colloidal carbon, as well as various types of dyes and pigments. Such materials are used in amounts varying with the desired properties of the photopolymerizable layer. The fillers are useful in improving the strength of the compositions, reducing tack and in addition, as coloring agents.

In the case of constituent (d), suitable active methylene compounds include 5,5-dimethyl-1,3-cyclohexanedione, 1,3-indanedione, 2-phenyl-1,3-indanedione, 1,3-diphenyl-1,3-propanedione, and 4,4,4-trifluoro-2,4-hexanedione. Suitable amines include the monoalkyl, dialkyl and trialkylamines, where alkyl has 1–6 carbon atoms, e.g., triethylamine, dibutylamine and trihexylamine; alkylenediamines of 1–4 carbon atoms, e.g., ethylenediamine and 1,3-propylenediamine; alkanolamines, e.g., ethanolamine, diethanolamine, and triethanolamine; and the polyamines disclosed in Chambers' U.S. Pat. No. 3,026,203, Mar. 20, 1962. Other suitable amines are disclosed in Assignee's Chambers application, Ser. No. 688,703, filed Dec. 7, 1967, now U.S. Pat. No. 3,479,185, U.S. Pat. No. 3,479,185, issued Nov. 18, 1969. Mixtures of two or more of constituents (d) are useful.

The photopolymerizable compositions may also contain thermal polymerization inhibitors, e.g., p-methoxyphenol, hydroquinone, and alkyl and aryl- substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene and dinitrobenzene, p-toluquinone and chloranil. They are present in 0.001 to 4 percent by weight of the compositions.

Since free-radical generating addition-polymerization initiators activatable by actinic radiation generally exhibit their maximum sensitivity in the ultraviolet range, the radiation source should usually furnish an effective amount of this radiation. Such sources include carbon arcs, mercury vapor arcs, fluorescent lamps with ultraviolet radiation emitting phosphors, argon glow lamps, electronic flash units and photographic flood lamps. Of these, the mercury-vapor arcs are customarily used at a distance of one and one-half to 20 inches from the photopolymerizable layer. It is noted, however, that in certain circumstances it may be advantageous to expose with visible light. In such cases, the radiation source should furnish an effective amount of visible radiation. Many of the radiation sources listed above furnish the required amount of visible light.

The photopolymerizable compositions and elements of this invention may be coated on metal surfaces to make presensitized lithographic printing plates, or to serve as photoresists in making etched or plated circuits or in chemical milling applications. They are also useful for preparing colored images from color separation negatives suitable for color proofing. The images formed with these elements may also be used for making copies by thermal transfer to a substrate. Specific uses will be evident to those skilled in the art; many uses are disclosed in U.S. Pat. Nos. 2,760,863; 3,060,023; and 3,060,026.

Suitable supports, including metal and flexible polymer film supports for the photopolymerizable layers, as well as processes for coating the supports, are described in the patents listed in the preceding paragraph.

The following examples will illustrate the practice of this invention but are not intended to limit its scope.

EXAMPLES

EXAMPLE I

| | |
|---|---|
| The following stock solution was prepared: | |
| Cellulose acetate (Acetyl 40.0%, ASTM viscosity 25) | 2.7 g. |
| Cellulose acetate butyrate (17% butyryl, ASTM viscosity 15) | 4.2 g. |
| Trimethylolpropane triacrylate | 13.5 g. |
| Acetone | 116.0 g. |

The initiators were dissolved in the stock solution and the solution was then coated with a 0.002 inch doctor knife on 0.001 inch polyethylene terephthalate film and allowed to dry. The dry coating was laminated at room temperature with a 0.001 inch polyethylene terephthalate film.

Samples of the elements so prepared were exposed through a $\sqrt{2}$ step wedge with a rotary diazoprinter equipped with ultraviolet fluorescent lamps. The average light intensity was 3.2 mw/cm$^2$ and exposure varied from 10 to 50 seconds. After exposure the cover sheet was stripped off and the exposed photopolymer layer was toned with a magenta pigment using a soft camel's hair brush. Excess pigment was removed by a gentle stream of air directed across the surface, and the transmission density of each step was measured with a densitometer (Macbeth TD–102 Diffuse Transmission Densitometer using a green filter).

To compare the effectiveness of different combinations quantitatively, the densities of the steps were plotted for each sample against the logarithm of exposure. The exposures at which the image density was 0.1 OD unit above the base and fog density was chosen as representative of the photographic speed of the composition. The corresponding energy $E_A$ (in millijoules/cm$^2$) and the concentrations of the component of the initiator system are tabulated in Table I. Note that a lower number means a photographically faster system. The aminophenyl ketone used in this series of experiments was Michler's Ketone; it was present in each case in the concentration of 0.047M in the dried matrix. Concentrations of adjuvants are also expressed in moles per liter of the coated and dried composition.

TABLE I

| Constituent (d) Compounds | Concentration (M) | $E_A$ (mj/cm²) |
|---|---|---|
| None | | 20.1 |
| 1,3-di(2-naphthyl)1,3-propanedione | 0.047 | 19.5 |
| 1,3-indanedione | 0.047 | 1.0 |
| 2-phenyl-1,3-indanedione | 0.047 | 1.0 |
| 5,5-dimethyl-1,3-cyclohexanedione | 0.047 | 5.9 |
| Hydrindantin | 0.047 | 3.3 |
| 1,3-phenyl-1,3-propanedione | 0.047 | 9.6 |
| 1,1,1-trifluoro-2,4-hexanedione | 0.14 | 19.0 |
| 4,4,4-trifluoro-1-(2-naphthyl)-1,3-butanedione | 0.047 | 1.9 |
| 4,4,4-trifluoro-1-(2-furyl)-1,3-butanedione | 0.047 | 6.0 |
| N-phenylglycine | 0.047 | 0.8 |
| N-phenylglycine | 0.047 | 0.8 |
| N-phenylglycine | 0.094 | 0.6 |
| N-(p-nitrophenyl)glycine | 0.047 | 3.6 |
| Triethanolamine | 0.11 | 2.6 |

EXAMPLE II

Photosensitive elements were prepared as in Example I, using several aminophenyl ketones as sensitizers with the auxiliary compound N-phenylglycine. The compounds used are listed in Table II. Control elements containing no N-phenylglycine were also prepared. The samples and controls were exposed through a carbon step wedge at an irradiance of 0.85 mw/cm² using the exposure device of Example I. The exposed samples were processed and analyzed as in Example I. In each case the sample containing the auxiliary compound had a greater photospeed than the control.

TABLE II 4,4′-bis (diethylamino)-benzophenone
4-dimethylaminobenzophenone
4-dimethylaminoacetophenone
4-dimethylaminobenzaldehyde
4-dimethylaminobenzoin

EXAMPLE III

The following stock solution was prepared:

| | |
|---|---|
| Poly(methyl methacrylate/methacrylic acid) (90/10) | 300 g. |
| Mixture of octanoic and decanoic acid esters of triethylene glycol | 36 g. |
| Trimethylolpropane triacrylate | 114 g. |
| C.I. Solvent Red No. 109 | 6 g. |
| 2-ethoxyethanol | 1798 g. |

To 375 g portions of stock solution were added the following initiator system.

| | |
|---|---|
| (A) Michler's ketone | 1.0 g. |
| (B) Michler's ketone | 1.0 g. |
| 1,3-indanedione | 0.54 g. |

Each of the solutions was coated on grained aluminum plates and dried.

The plates were overcoated with the following composition and dried.

| | |
|---|---|
| Polyvinyl pyrrolidone (M.W. 30,000) | 90 g. |
| Polyvinyl alcohol (medium viscosity 88% saponified) | 60 g. |
| 2-Ethoxyethanol | 45 ml. |
| Ethanol | 45 ml. |
| Surfactant (isooctyl phenyl polyethoxy ethanol) (10% aqueous solution) | 15 ml. |

Samples of the element were exposed through a negative 21 $\sqrt{2}$ step Graphic Arts Technical Foundation exposure wedge in a vacuum frame with a carbon arc (B-1C Constantarc - 140-ampere No. 1112-Ld 612 Macbeth Arc Lamp Company, Philadelphia, Pa.) at a distance of 56 inches for 26 seconds. The exposed samples were developed with the following developer solution:

| | |
|---|---|
| Trisodium phosphate dodecahydrate | 25 g. |
| Sodium dihydrogen phosphate monohydrate | 5 g. |
| Octyl phenoxy polyethoxy ethanol | 2 ml. |
| 2-butoxyethanol | 70 ml. |
| Water to make | 1000 ml. |
| pH adjusted to | 11.0 |

The samples were processed by soaking in the developer for 1 minute, swabbing for 45 seconds, and water rinsing. The polymerized composition remained on the plate, forming an ink-receptive negative step edge image suitable for a lithographic printing plate. The relative speeds of the different systems are tabulated in Table III. A greater number os steps exposed indicates a greater photographic speed. It is evident that a photographic speed increase is obtained by adding an auxiliary compound to the mixture.

TABLE III

| Mixture | $\sqrt{2}$ Steps Polymerized |
|---|---|
| (A) | 2–3 |
| (B) | 8–9 |

Example IV

The following solution was prepared.

| | |
|---|---|
| Polymethyl methacrylate | 50 g. |
| Trimethylolpropane trimethacrylate | 64 g. |
| Michler's ketone | 2.5 g. |
| Polyoxyethylene (4) lauryl ether | 5.0 g. |
| N-phenylglycine | 3.5 g. |
| Trichloroethylene to make | 350 g. |

The solution was coated with a doctor knife on 0.004 inch polyethylene terephthalate film made according to Example IV of Alles, U.S. Pat. No. 2,779,684 and allowed to dry. The dry thickness of the coating was about 0.0005 inch. The dry sample was exposed through a process transparency to a 1000-watt quartz-iodine tungsten filament lamp operated at 115 volts for 45 seconds at a distance of 36 inches. The exposed sample was dusted with a black pigment and the excess pigment was removed revealing a black positive image where the pigment adhered to the tacky, unexposed portions of the layer.

The embodiments of the invention in which an exclusive property or privilege is claimed are defined as follows:

1. A photopolymerizable composition comprising:

a. at least one non-gaseous ethylenically unsaturated compound containing at least one terminal ethylenic group, having a boiling point above 100° C. at normal atmospheric pressure and being capable of forming a high polymer by photoinitiated addition polymerization, b. a thermoplastic macromolecular organic polymer binder, c. a p-aminophenyl ketone, and d. as the sole additional free-radical producing compound a hydrogen donor, free-radical producing compound selected from the group consisting of active methylene compounds and amino compounds;

constituents (a) and (b) being present in amount from 3 to 100 and 0 to 97 parts by weight, there being present for every 100 parts by weight of (a) or (a) and (b), from 0.001 to 10 parts by weight of each of each of constituents (c) and (d).

2. A composition according to claim 1, wherein the polymer binder is present in an amount of at least 5 parts by weight.

3. A composition according to claim 2, wherein the p-aminophenyl ketone has the formula

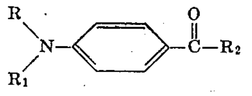

where R and $R_1$ are each H or an alkyl radical of 1-4 carbon atoms and $R_2$ is alkyl of 1-4 carbon atoms or phenyl.

4. A composition according to claim 2, wherein said p-aminophenyl ketone is p,p'-bis(dimethylamino)benzophenone.

5. A composition according to claim 2, wherein constituent (d) is N-phenylglycine.

6. A photopolymerizable element comprising a support bearing a layer of the composition defined by claim 1.

7. An element according to claim 6, wherein a thermoplastic polymer binder is present in an amount of at least 5 parts by weight.

8. An element according to claim 6, wherein the p-aminophenyl ketone has the formula

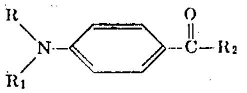

where R and $R_1$ are each H or an alkyl radical of 1–4 carbon atoms and $R_2$ is alkyl of 1–4 carbon atoms or phenyl.

9. An element according to claim 6, wherein the p-aminophenyl ketone is p,p'-bis(dimethylamino)benzophenone.

10. An element according to claim 6, wherein the unsaturated compound is an acrylic or methacrylic acid ester containing 1–5 terminal ethylenic groups.

11. An element according to claim 6, wherein the support is a metal sheet or plate.

12. An element according to claim 6, wherein said support is a macromolecular organic polymer film.

13. An element according to claim 6, wherein constituent (d) is N-phenylglycine.

* * * * *